(12) United States Patent
Huang et al.

(10) Patent No.: US 12,527,037 B2
(45) Date of Patent: Jan. 13, 2026

(54) SEMICONDUCTOR DEVICE WITH FLOATING GATE, AND METHOD FOR MANUFACTURING THE SAME

(71) Applicant: Winbond Electronics Corp., Taichung (TW)

(72) Inventors: Tzu-Yun Huang, Taichung (TW); Chung-Hsien Liu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 383 days.

(21) Appl. No.: 18/355,834

(22) Filed: Jul. 20, 2023

(65) Prior Publication Data

US 2024/0194755 A1    Jun. 13, 2024

(30) Foreign Application Priority Data

Dec. 9, 2022    (TW) .................................. 111147364

(51) Int. Cl.
*H10D 30/68*    (2025.01)
*H10D 30/01*    (2025.01)
*H10D 64/01*    (2025.01)
*G11C 16/04*    (2006.01)

(52) U.S. Cl.
CPC ..... *H10D 30/6894* (2025.01); *H10D 30/0411* (2025.01); *H10D 64/017* (2025.01); *G11C 16/0408* (2013.01)

(58) Field of Classification Search
CPC ....... H10D 30/0411; H10D 30/68–689; H10D 30/6891–6894; H10D 64/017; H10D 64/035; H10D 62/117; H10D 64/01; H10D 30/0273; H10D 30/0614; H10B 41/00–70; H10B 41/30; G11C 16/0408–0458; G11C 16/0483; G11C 11/5621–5642; G11C 2216/06–10; H01L 23/544

See application file for complete search history.

(56) References Cited

U.S. PATENT DOCUMENTS

| | | | | |
|---|---|---|---|---|
| 4,929,988 A | * | 5/1990 | Yoshikawa | H10D 64/035 257/E29.302 |
| 5,741,719 A | * | 4/1998 | Kim | H10B 69/00 438/257 |
| 5,889,304 A | * | 3/1999 | Watanabe | H10B 41/30 365/185.11 |
| 6,153,904 A | * | 11/2000 | Yang | H10D 30/0411 438/564 |

(Continued)

FOREIGN PATENT DOCUMENTS

CN    108735813 B    12/2021
TW    I618224 B    3/2018

*Primary Examiner* — Maliheh Malek
(74) *Attorney, Agent, or Firm* — MUNCY, GEISSLER, OLDS & LOWE, P.C.

(57) ABSTRACT

A semiconductor structure includes a substrate, a dielectric structure, a floating gate, and a control gate. The substrate has a protrusion, a first recess, and a second recess, wherein the first recess and the second recess are on opposite sides of the protrusion. The dielectric structure extends from the first recess and the second recess to above a top surface of the protrusion. The floating gate is disposed over the substrate and adjoins a sidewall of the dielectric structure. The control gate is disposed over the floating gate and extends over a top surface of the dielectric structure to directly above the protrusion.

18 Claims, 7 Drawing Sheets

(56) References Cited

U.S. PATENT DOCUMENTS

| | | | |
|---|---|---|---|
| 6,372,564 B1* | 4/2002 | Lee | H10D 30/6894 438/257 |
| 6,461,916 B1* | 10/2002 | Adachi | H10B 41/41 438/257 |
| 6,770,934 B1* | 8/2004 | Hung | H10B 69/00 257/330 |
| 8,138,077 B2* | 3/2012 | Cho | H10D 64/035 438/257 |
| 8,575,680 B2* | 11/2013 | Shin | H10B 41/30 257/315 |
| 9,147,730 B2* | 9/2015 | Xie | H01L 21/3085 |
| 9,728,543 B1* | 8/2017 | Pan | H10D 30/681 |
| 9,741,727 B2* | 8/2017 | Liu | H10D 84/811 |
| 10,699,939 B2* | 6/2020 | Hu | H10D 30/0243 |
| 11,374,014 B2* | 6/2022 | Wang | H10B 41/10 |
| 11,424,254 B2* | 8/2022 | Shen | H10D 30/683 |
| 12,396,170 B2* | 8/2025 | Wen | H10D 30/0411 |
| 12,402,361 B2* | 8/2025 | Liu | H10D 30/68 |
| 2004/0056300 A1* | 3/2004 | Choi | H10D 30/685 257/E21.422 |
| 2004/0132251 A1* | 7/2004 | Yoshino | H01L 21/2652 257/E21.337 |
| 2005/0142762 A1* | 6/2005 | Koh | H10B 41/30 438/296 |
| 2005/0233522 A1* | 10/2005 | Iguchi | H10B 41/30 438/257 |
| 2006/0148177 A1* | 7/2006 | Kim | H10B 69/00 257/E29.302 |
| 2007/0093020 A1* | 4/2007 | Kim | H10B 41/30 438/243 |
| 2008/0087934 A1* | 4/2008 | Ahn | H10D 30/687 438/266 |
| 2008/0242073 A1* | 10/2008 | Hong | H10D 64/035 257/E21.294 |
| 2011/0049605 A1* | 3/2011 | Ishiguro | H10D 30/6891 257/E21.209 |
| 2013/0001682 A1* | 1/2013 | Tang | H10D 64/691 438/270 |
| 2013/0032871 A1* | 2/2013 | Shin | H01L 21/764 257/315 |
| 2013/0228842 A1* | 9/2013 | Kotou | H10D 30/687 438/587 |
| 2013/0309838 A1* | 11/2013 | Wei | H01L 21/76229 257/E21.546 |
| 2015/0294976 A1* | 10/2015 | Kim | H01L 21/3086 438/702 |
| 2015/0303207 A1* | 10/2015 | Liu | H10D 30/6894 257/316 |
| 2015/0371709 A1* | 12/2015 | Kai | G11C 16/0425 365/185.17 |
| 2016/0056045 A1* | 2/2016 | Huang | H10D 30/62 438/694 |
| 2017/0025425 A1* | 1/2017 | Yaegashi | H10B 41/35 |
| 2017/0062447 A1* | 3/2017 | Mukai | H10D 30/0411 |
| 2017/0069648 A1* | 3/2017 | Yamaguchi | H01L 21/28518 |
| 2018/0308746 A1* | 10/2018 | Hu | H01L 21/3086 |
| 2020/0279930 A1* | 9/2020 | Chu | H10B 41/43 |
| 2020/0402987 A1* | 12/2020 | Wang | H10D 30/68 |
| 2021/0183874 A1* | 6/2021 | Shen | H10D 30/0229 |
| 2023/0140646 A1* | 5/2023 | Wu | H01L 21/764 257/316 |
| 2024/0096718 A1* | 3/2024 | Wang | H01L 22/32 |
| 2024/0113185 A1* | 4/2024 | Woo | H10D 30/6892 |
| 2024/0147715 A1* | 5/2024 | Wen | H10B 41/30 |
| 2024/0222525 A1* | 7/2024 | Liu | H01L 21/76224 |
| 2025/0081542 A1* | 3/2025 | Tsai | H01L 21/76232 |

* cited by examiner

SEMICONDUCTOR DEVICE WITH FLOATING GATE, AND METHOD FOR MANUFACTURING THE SAME

CROSS REFERENCE TO RELATED APPLICATIONS

This Application claims priority of Taiwan Patent Application No. 111147364, filed on Dec. 9, 2022, the entirety of which is incorporated by reference herein.

BACKGROUND OF THE INVENTION

Field of the Invention

The present invention relates to semiconductor manufacturing, and, in particular, to semiconductor structures and methods for forming the same.

Description of the Related Art

As the size of semiconductor structures continues to shrink, the difficulty of manufacturing these semiconductors has increased significantly. For example, the design for the patterned mask limits further downscaling of the semiconductor structure, thereby limiting improvements to dimension-related performance. Therefore, there is a need to improve the semiconductor structure and the method for forming the same, to improve the performance of the semiconductor structure.

BRIEF SUMMARY OF THE INVENTION

According to some embodiments of the present disclosure, a semiconductor structure is provided. The semiconductor structure includes a substrate, a dielectric structure, a floating gate, and a control gate. The substrate has a protrusion, a first recess, and a second recess, wherein the first recess and the second recess are on opposite sides of the protrusion. The dielectric structure extends from the first recess and the second recess to above the top surface of the protrusion. The floating gate is disposed over the substrate and adjoins the sidewall of the dielectric structure. The control gate is disposed over the floating gate and extends over the top surface of the dielectric structure to directly above the protrusion.

According to some embodiments of the present disclosure, a method for forming a semiconductor structure is provided. The method includes forming a floating gate over a substrate. The method includes forming a trench in the floating gate to expose a top surface of the substrate. The method includes forming a self-aligned core structure in the trench; forming a photoresist such that the photoresist includes a first portion covering a top surface of the floating gate and a top surface of the self-aligned core structure and a second portion covering a sidewall of the self-aligned core structure. The method includes removing the self-aligned core structure and the first portion of the photoresist and leaving the second portion of the photoresist. The method includes etching the substrate using the second portion of the photoresist as a mask to form a first recess, the second recess and a buried dummy structure.

BRIEF DESCRIPTION OF THE DRAWINGS

FIG. 3A-1 is a top view illustrating the semiconductor structure in FIG. 3A according to some embodiments.

DETAILED DESCRIPTION OF THE INVENTION

The following describes semiconductor structures and methods for forming the same according to some embodiments of the present disclosure, and, in particular, to memory devices. The present disclosure disposes a buried dummy structure between an active region and a dummy region, wherein the distance between the buried dummy structure and the active region is less than the distance between the dummy region and the active region, thereby improving the efficiency of the semiconductor structure.

Figure 1A:
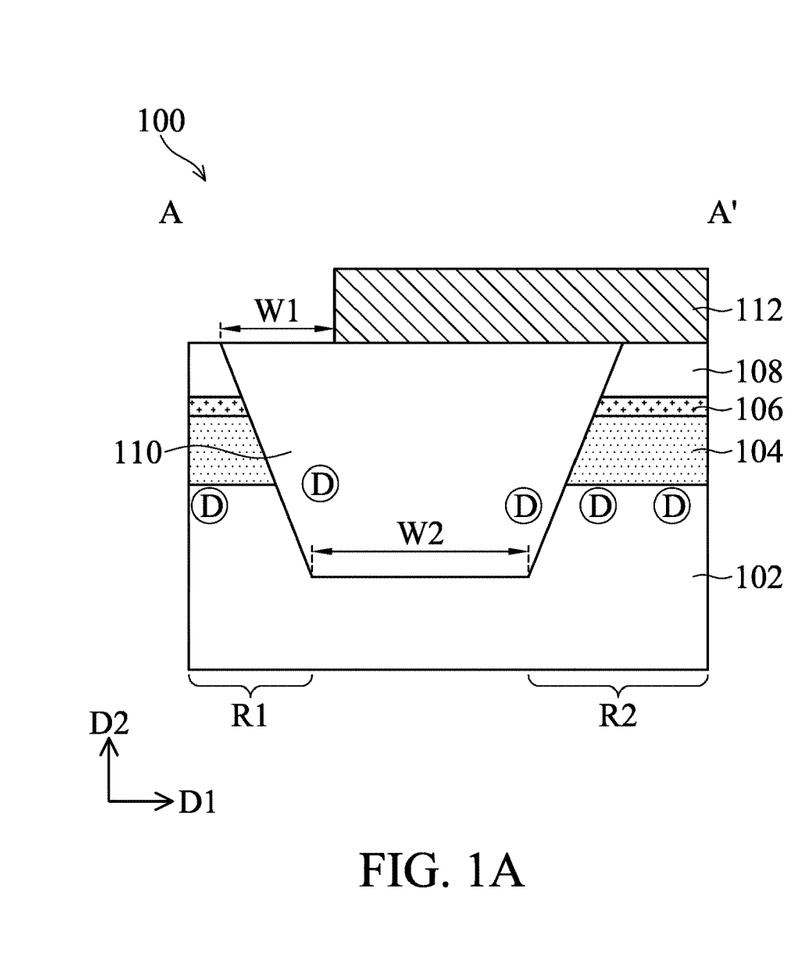
FIGS. 1A and 2A are cross-sectional views illustrating semiconductor structures according to some embodiments.

FIG. 1A is a cross-sectional view illustrating a semiconductor structure 100 according to some embodiments. As shown in FIG. 1A, the semiconductor structure 100 may include a substrate 102. The substrate 102 may include dopants D. The dopants D may be p-type dopants, such as boron. Alternatively, the dopants D may be n-type dopants, such as phosphorus or arsenic.

As shown in FIG. 1A, according to some embodiments, the semiconductor structure 100 includes a floating gate 104, inter-gate dielectric layers 106, 108, and a control gate 112 over a substrate 102. The control gate 112 allows charge to enter or leave the floating gate 104 for write or erase operations.

As shown in FIG. 1A, according to some embodiments, the semiconductor structure 100 includes a dielectric structure 110 disposed over a substrate 102. The dielectric structure 110 may extend through the inter-gate dielectric layers 108, 106, the floating gate 104, and into the substrate 102. The semiconductor structure 100 may have a dummy region R1 and an active region R2 respectively disposed on opposite sides of the dielectric structure 110. The control gate 112 is not disposed over the dummy region R1. Disposing the dummy region R1 can reduce the process load, for example, reduce the etch process load, planarization process load, or the like.

According to some embodiments, the control gate 112 extends over the top surface of the dielectric structure 110 in a first direction D1. The first direction D1 is different from a second direction D2, and the layers are stack in the second direction D2. The first direction D1 may be substantially perpendicular to the second direction D2. As shown in FIG. 1A, in the first direction D1, there is a distance W1 between the control gate 112 and the dummy region R1, and at the bottom surface of the dielectric structure 110, there is a distance W2 between the dummy region R1 and the active region R2. According to some embodiments, the distance W1 is in a range of about 0.1 µm to about 0.5 µm, and the distance W2 is in a range of about 0.9 µm to 1.2 µm.

Due to limitations in the manufacturing process, such as the design of the patterned mask, the distance W1 and the distance W2 cannot be further reduced by the patterning process. However, as shown in FIG. 1A, the larger distance W2 makes the repulsion between the substrates 102 on opposite sides of the dielectric structure 110 smaller, which makes the dopants D easily enter the dielectric structure 110, thereby reducing the threshold voltage Vt.

Figure 1B:
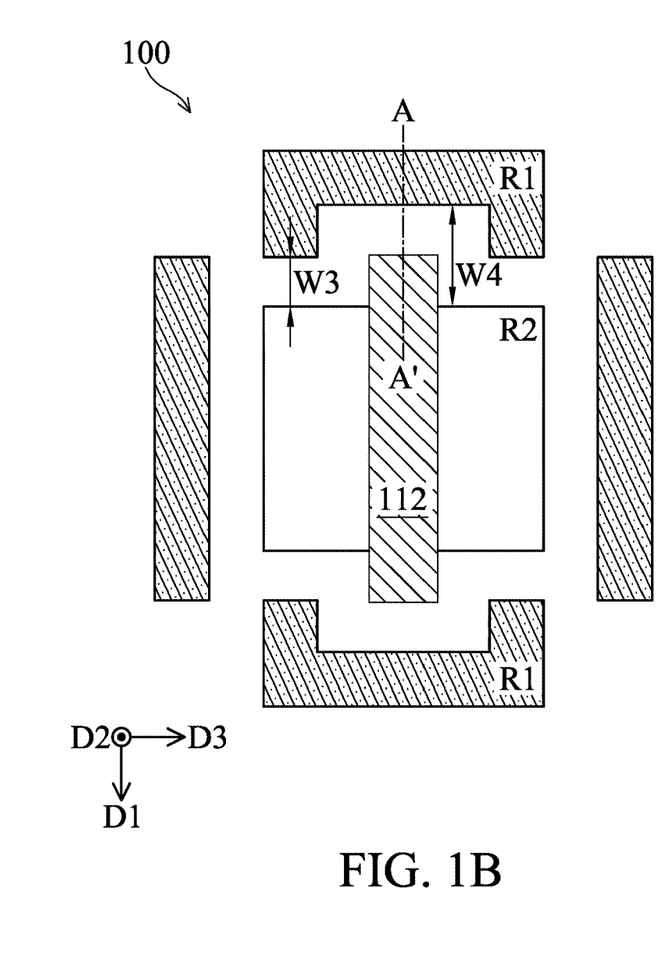
FIGS. 1B, 2B and 4 are top views illustrating semiconductor structures according to some embodiments.

FIG. 1B is a top view illustrating the semiconductor structure 100 according to some embodiments. The semiconductor structure 100 in FIG. 1A may be as illustrated in the cross-sectional view along line A-A' in FIG. 1B. As shown in FIG. 1B, the dummy region R1 is disposed around an active region R2 and separated from the active region R2. As discussed above, the mask design limitation prevents the distance between the dummy region R1 and the control gate 112 from being further reduced. Therefore, a distance W4 between the dummy region R1 and the active region R2 will be greater at the control gate 112 than a distance W3 between the dummy region R1 and the active region R2 at an edge of the active region R2. For example, the distance W3 may be about 0.25 μm, and the distance W4 may be about 0.5 μm. This distance difference prevents the dummy region R1 from uniformly reducing the process load on the entire active region R2, resulting in unstable performance of the semiconductor structure 100. Accordingly, the present disclosure provides the following embodiments to improve the above-mentioned issues.

Figure 2A:
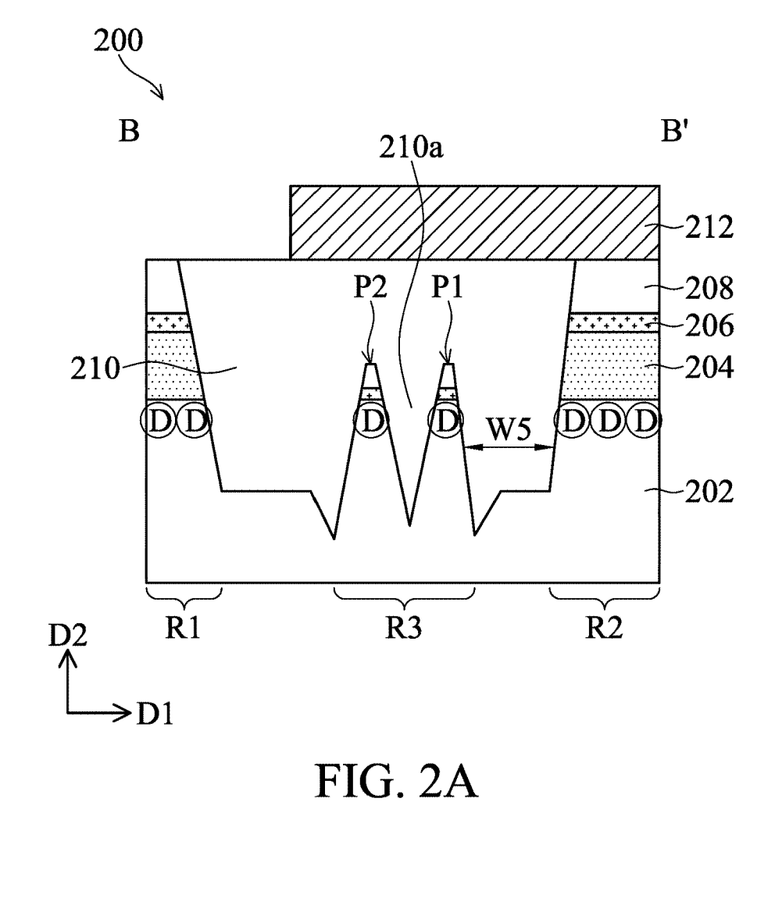

FIG. 2A is a cross-sectional view illustrating a semiconductor structure 200 according to some embodiments. As shown in FIG. 2A, the semiconductor structure 200 may include a substrate 202. The semiconductor structure 200 may include a floating gate 204, inter-gate dielectric layers 206, 208, and a control gate 212 over the substrate 202, and these elements may be similar to the substrate 102, the floating gate 104, the inter-gate dielectric layers 106, 108, and the control gate 112 of semiconductor structure 100, respectively, and will not be repeated.

As shown in FIG. 2A, according to some embodiments, the semiconductor structure 200 includes buried dummy structures P1 and P2 disposed over a region R3 between the dummy region R1 and the active region R2. The buried dummy structures P1 and P2 may include a pair of pillar structures, each of which may have a tapered sidewall. That is, the width of the bottom of the pillar structure may be greater than the width of the top of the pillar structure. It should be noted that the two buried dummy structures P1 and P2 illustrated in FIG. 2A are provided for illustrative purposes only, and the semiconductor structure 200 may include more buried dummy structures.

According to some embodiments, the semiconductor structure 200 includes a dielectric structure 210 disposed over the substrate 202. The dielectric structure 210 may extend through the floating gate 204, the inter-gate dielectric layers 206, 208, and into the substrate 202. As shown in FIG. 2A, the dielectric structure 210 may cover top surfaces and sidewalls of the buried dummy structures P1 and P2, and a portion 210a of the dielectric structure 210 may extend between the pillar structures of the buried dummy structures P1 and P2.

Disposing the buried dummy structures P1 and P2 can shorten the distance between the substrate 202 on opposite sides of the dielectric structure 210 to a distance W5, which is smaller than the distance W2 in FIG. 1A. According to some embodiments, the distance W5 is in a range of about 0.25 μm to 1 μm. The shorter distance W5 can increase the repulsion between the opposite sides of the substrates 202, so the dopants D is less likely to enter the dielectric structure 210. As a result, the threshold voltage Vt can be maintained, thereby improving the performance of the semiconductor structure 200.

Figure 2B:
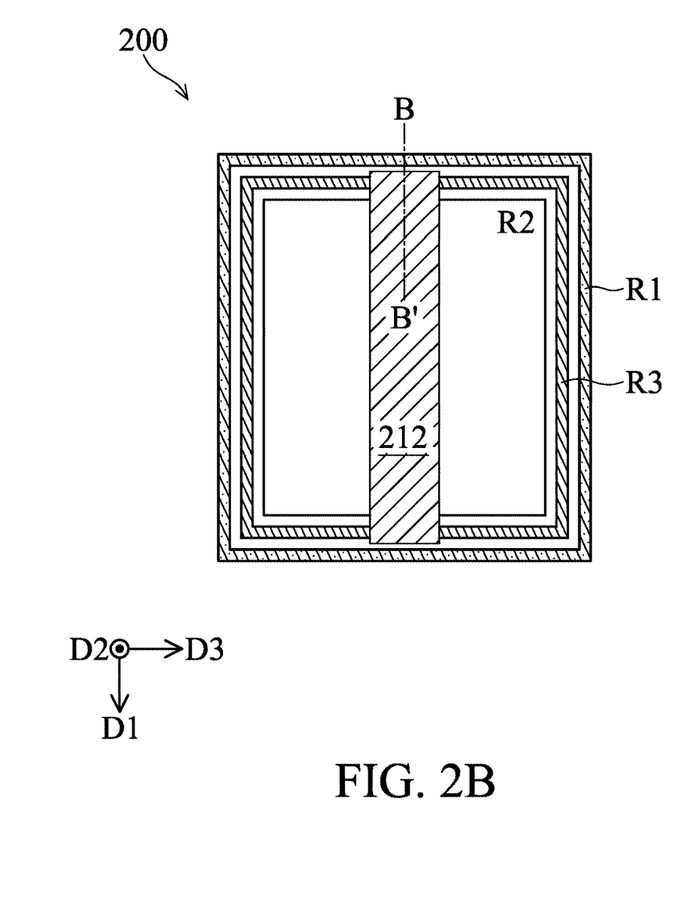

FIG. 2B is a top view illustrating the semiconductor structure 200 according to some embodiments. The semiconductor structure 200 in FIG. 2A may be as illustrated in the cross-sectional view along line B-B' in FIG. 2B. As shown in FIG. 2B, according to some embodiments, the region R3 of the buried dummy structures P1 and P2 may surround the active region R2, and the distance between the region R3 and the active region R2 can be substantially the same distance. In addition, the dummy region R1 may surround the active region R2 and the region R3 of the buried dummy structures P1 and P2, and the distance between the dummy region R1 and the active region R2 may be substantially the same distance. Accordingly, the process load can be uniformly reduced, and thus the performance of the semiconductor structure 200 can be increased.

The method for forming a semiconductor structure 300 which includes a buried dummy structure is described below with reference to FIGS. 3A-3H.

Figure 3A:
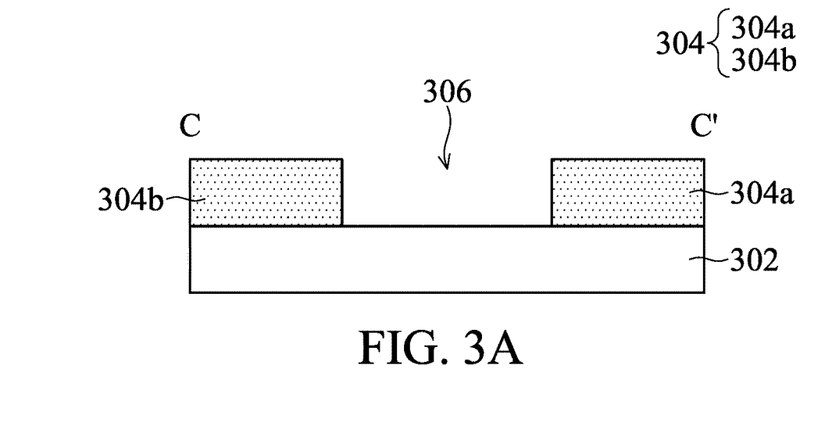
FIGS. 3A-3H are cross-sectional views illustrating various stages of forming a semiconductor structure according to some embodiments.

According to some embodiments, a floating gate 304 is formed over a substrate 302 as shown in FIG. 3A. The substrate 302 may be similar to the substrate 102 of the semiconductor structure 100, and will not be repeated. The floating gate 304 may be formed by forming the material of the floating gate 304, such as polysilicon or any suitable materials, by a deposition process. Next, n-type or p-type dopants may be implanted into the material of the floating gate 304, and then an annealing process may be performed to activate the implanted dopants.

Then, according to some embodiments, a trench 306 is formed in the material of the floating gate 304 to expose a portion of the substrate 302. The trench 306 may be formed by disposing a mask layer (not shown) over the material of the floating gate 304, and then performing an etching process using the mask layer as an etching mask.

As shown in FIG. 3A, according to some embodiments, the trench 306 divides the material of floating gate 304 into a first portion 304a and a second portion 304b, wherein the first portion 304a of the floating gate 304 defines an active region (e.g., the active region 2A in FIG. 2A), and the second portion 304b of the floating gate 304 defines a dummy region (e.g., the dummy region R1 in FIG. 2A).

Figure 3A:
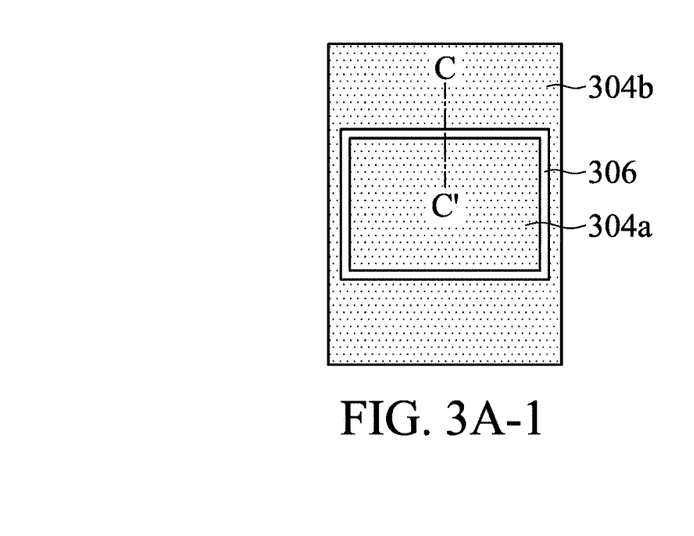

FIG. 3A-1 is a top view illustrating the semiconductor structure in FIG. 3A, according to some embodiments. The semiconductor structure in FIG. 3A may be as illustrated in the cross-sectional view along line C-C' in FIG. 3B. As shown in FIG. 3A-1, the trench 306 may surround the first portion 304a of the floating gate 304, and the second portion 304b of the floating gate 304 may surround the trench 306. In other words, the trench 306 may surround the active region, and the dummy region may surround the trench 306.

Figure 3B:
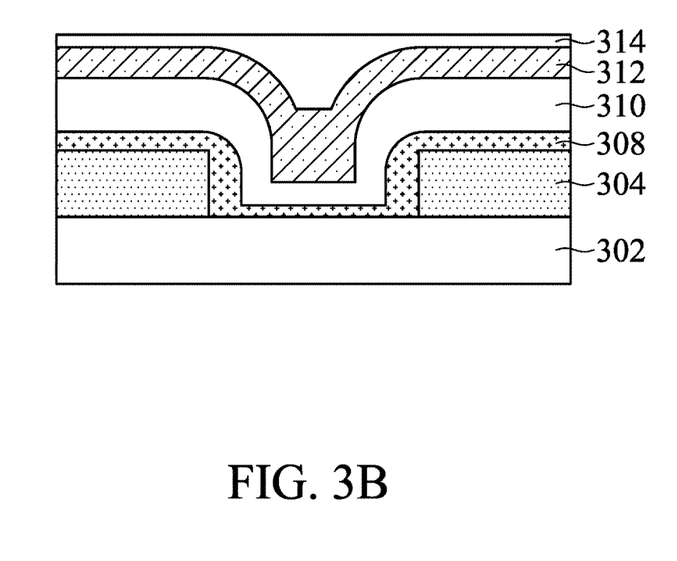

According to some embodiments, inter-gate dielectric layers 308, 310 are formed over the floating gate 304 and in the trench 306, as shown in FIG. 3B. The inter-gate dielectric layers 308, 310 may cover the top surface, the sidewall of the floating gate 304, and the top surface of the substrate 302 in the trench 306. The inter-gate dielectric layers 308, 310 may be formed in the same or different processes.

A first layer of the inter-gate dielectric layer 308 may include a first dielectric material, and a second layer of the inter-gate dielectric layer 310 may include a second dielectric material which is different from the first dielectric material. According to some embodiments, the first layer of the inter-gate dielectric layer 308 includes nitride (e.g., silicon nitride), and the layer of the second inter-gate dielectric layer 310 includes an oxide (e.g., silicon oxide).

Although the inter-gate dielectric layers include a two-layer structure as illustrated herein, the present disclosure is not limited thereto, and the inter-gate dielectric layer may be a single-layer or multi-layer structure. For example, according to some embodiments, the inter-gate dielectric layer includes an oxide-nitride-oxide structure which includes a silicon nitride layer sandwiched between two silicon oxide layers. Alternatively, according to other embodiments, the inter-gate dielectric layer includes a single layer structure, such as a single layer of oxide or a single layer of nitride.

Then, according to some embodiments, a mask layer 312 is formed over the inter-gate dielectric layer 310 by a deposition process. The material of the mask layer 312 may include silicon oxide, silicon nitride, silicon oxynitride, silicon carbide, silicon carbonitride, the like, or a combination thereof, and may include a single-layer or multi-layer structure. The mask layer 312 may include a material which is different from that of the inter-gate dielectric layer 310. For example, in an embodiment where the inter-gate dielectric layer 310 includes silicon oxide, the mask layer 312 may include silicon carbide.

Then, a bottom anti-reflective coating (BARC) layer 314 is formed over the mask layer 312 to fill the remainder of the trench 306, according to some embodiments. The material of the BARC layer 314 may include any suitable polymer, and may include a single-layer or a multi-layer structure. As shown in FIG. 3B, the BARC layer 314 may have a flat top surface.

Figure 3C:
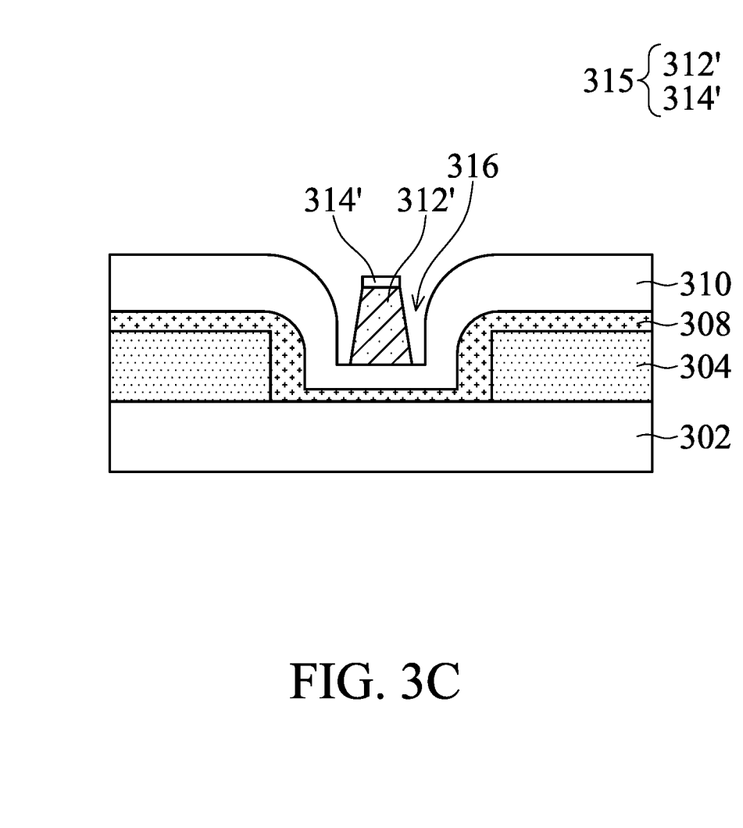

Then, as shown in FIG. 3C, the mask layer 312 and the BARC layer 314 are trimmed and trenches 316 are formed, according to some embodiments. The trimmed mask layer 312' and the trimmed BARC layer 314' may form a self-aligned core structure 315, and the trenches 316 may be disposed on opposite sides of the self-aligned core structure 315. In particular, trimming the mask layer 312 and the BARC layer 314 may include removing a portion of the mask layer 312 and the BARC layer 314 over the floating gate 304 by an etching process, and leaving another portion of the mask layer 312 and the BARC layer 314 between the floating gate 304.

As shown in FIG. 3C, according to some embodiments, the self-aligned core structure 315 has a tapered sidewall. In particular, in a direction substantially parallel to the top surface of the substrate 302, the width of the bottom surface of the trimmed BARC layer 314' may be greater than the width of the top surface of the trimmed BARC layer 314', and may be greater than the width of the top surface of the trimmed mask layer 312'. Furthermore, in a direction substantially perpendicular to the top surface of the substrate 302, the thickness of the trimmed BARC layer 314' may be greater than the thickness of the trimmed mask layer 312'.

Figure 3D:
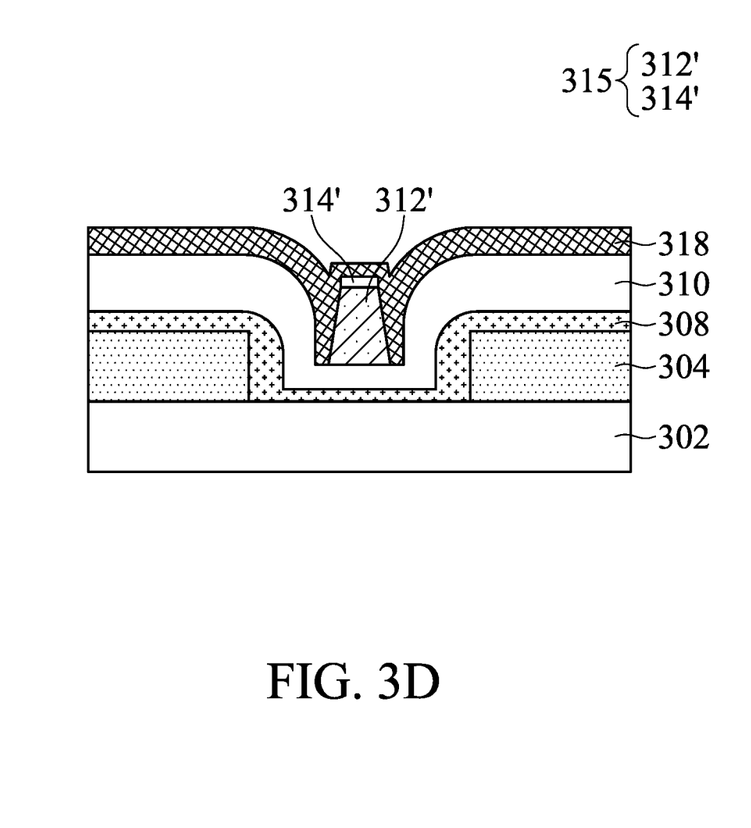

Then, as shown in FIG. 3D, a photoresist 318 is conformally formed over the inter-gate dielectric layer 310 and the self-aligned core structure 315, according to some embodiments. The photoresist 318 may fill the trenches 316, cover the top surface and sidewalls of the self-aligned core structure 315, and cover the top surface and sidewalls of the inter-gate dielectric layer 310.

Figure 3E:
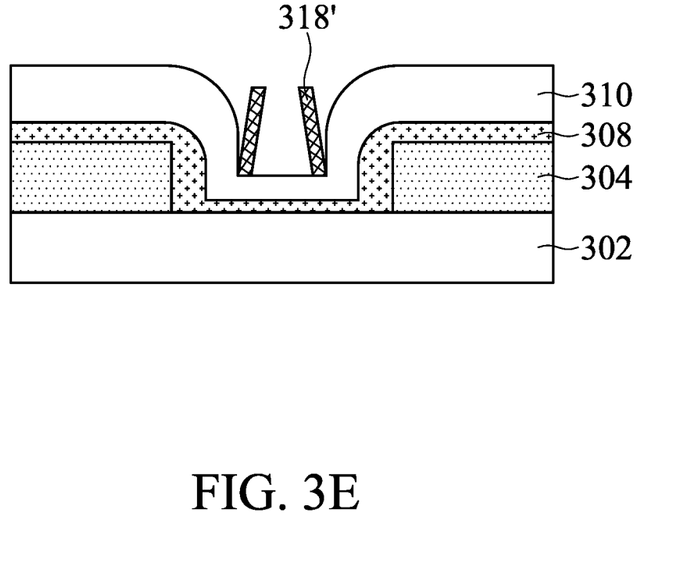

Then, as shown in FIG. 3E, the self-aligned core structure 315 and a portion of the photoresist 318 are removed and another portion of the photoresist 318 is remained, according to some embodiments. The self-aligned core structure 315 and the portion of the photoresist 318 may be removed by the same or different etching processes. In some embodiments, the photoresist 318 is remained to cover a portion of a sidewall of the self-aligned core structure 315. In other words, the remaining photoresist 318' may be disposed in the trenches 316 shown in FIG. 3C.

As shown in FIG. 3E, the remaining photoresist 318' may include a pair of sheet structures, and the distance between the sheet structures may be tapered. That is, according to some embodiments, the distance between the bottoms of the sheet structures is greater than the distance between the tops of the sheet structures.

Figure 3F:
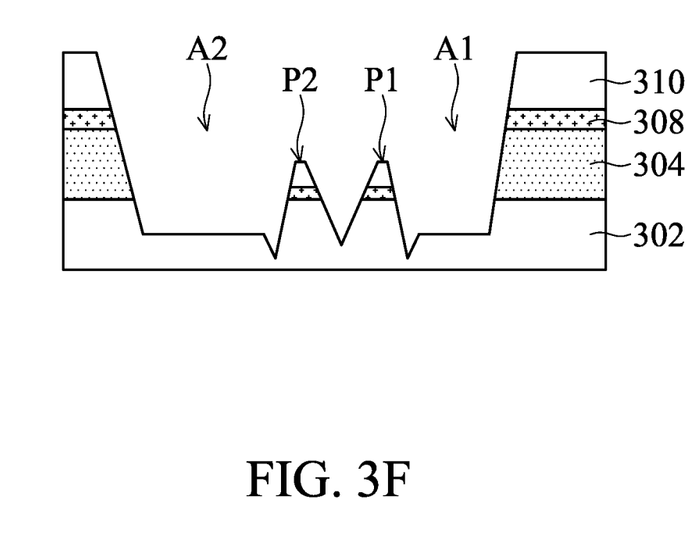

Then, as shown in FIG. 3F, according to some embodiments, an etching process is performed using the remaining photoresist 318' as a mask. The etching process may etch through the inter-gate dielectric layer 310, 308, the floating gate 304 and the substrate 302 and form a first recess A1 and a second recess A2, and buried dummy structures P1 and P2 may be formed between the first recess A1 and the second recess A2.

The shapes of the buried dummy structures P1 and P2 can be adjusted by adjusting the shape of the remaining photoresist 318', which can be defined by the shape of the self-aligned core structure 315. According to some embodiments, the aspect ratio of the trenches 316 is adjusted by adjusting the thickness of the self-aligned core structure 315, thereby changing the aspect ratio of the remaining photoresist 318'.

As shown in FIG. 3F, the buried dummy structures P1 and P2 may include protrusions of the substrate 302 and the inter-gate dielectric layers 308, 310 and do not include the floating gate 304. As previously mentioned, the etching process removes the floating gate 304 in the trench 306 (FIG. 3A), so that the buried dummy structures P1 and P2 may not include the floating gate 304, and the inter-gate dielectric layer 308, 310 may in contact with the protrusions of the substrate 302.

As shown in FIG. 3F, the buried dummy structures P1 and P2 may include a pair of pillar structures, each of which may have a tapered sidewall. That is, the width of the bottom of the pillar structure may be greater than the width of the top of the pillar structure.

According to some embodiments, the bottom surfaces of the first recess A1 and the second recess A2 may be concave instead of flat. As shown in FIG. 3F, the first recess A1 may have a V-shaped bottom surface adjacent to the buried dummy structure P1, and a higher horizontal bottom surface connected to the V-shaped bottom surface. Similarly, the second recess A2 may have a V-shaped bottom surface adjacent to the buried dummy structure P2, and a higher horizontal bottom surface connected to the V-shaped bottom surface. It should be noted that, depending on the etching process, the V-shaped bottom surfaces may be U-shaped bottom surfaces or other shaped bottom surfaces.

Figure 3G:
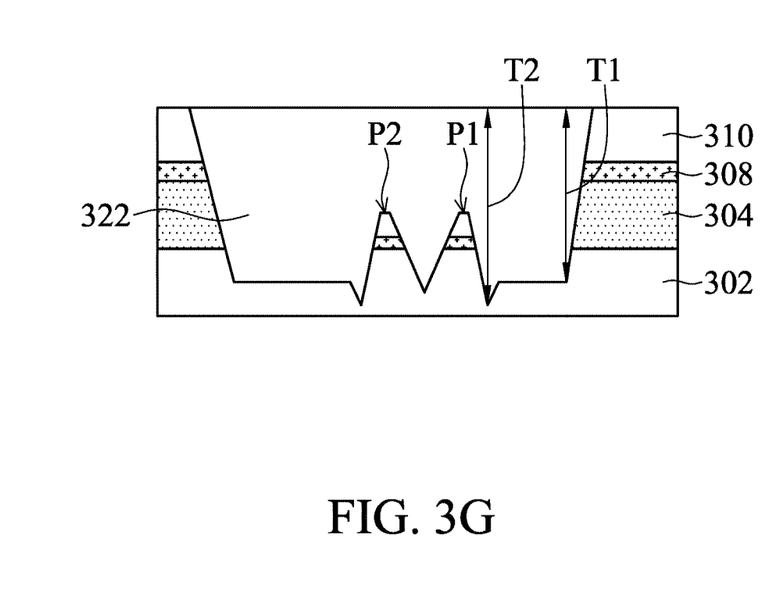

Then, as shown in FIG. 3G, a dielectric structure 322 is formed over the substrate 302, according to some embodiments. The dielectric structure 322 may be formed by depositing the material of the dielectric structure 322 over the substrate 302 by a deposition process to fill the first recess A1 and the second recess A2, and then performing a planarization process, such as a chemical mechanical polishing process, to make the top surface of the dielectric structure 322 coplanar with the top surface of the inter-gate dielectric layer 310. The material of the dielectric structure 322 may include spin-on-carbon, spin-on-glass, the like, or a combination thereof.

As shown in FIG. 3G, the dielectric structure 322 may extend from the first recess A1 and the second recess A2 to above the top surfaces of the buried dummy structures P1, P2, and covers the sidewall of the buried dummy structures P1, P2. As mentioned above, the first recess A1 and the second recess A2 may have non-flat bottom surfaces, so the dielectric structure 322 may have a non-uniform thickness and a non-flat bottom surface. According to some embodiments, the dielectric structure 322 has a first thickness T1 away from the buried dummy structures P1 and P2 and a second thickness T2 adjacent to the buried dummy structures P1 and P2, and the second thickness T2 is less than the first thickness T1.

In addition, similar to the shapes of the bottom surfaces of the first recess A1 and the second recess A2, the dielectric structure 322 may have a plurality of V-shaped bottom surfaces (or U-shaped bottom surfaces) and a plurality of flat bottom surfaces each connected to one of the V-shaped bottom surfaces (or U-shaped bottom surfaces).

Figure 3H:
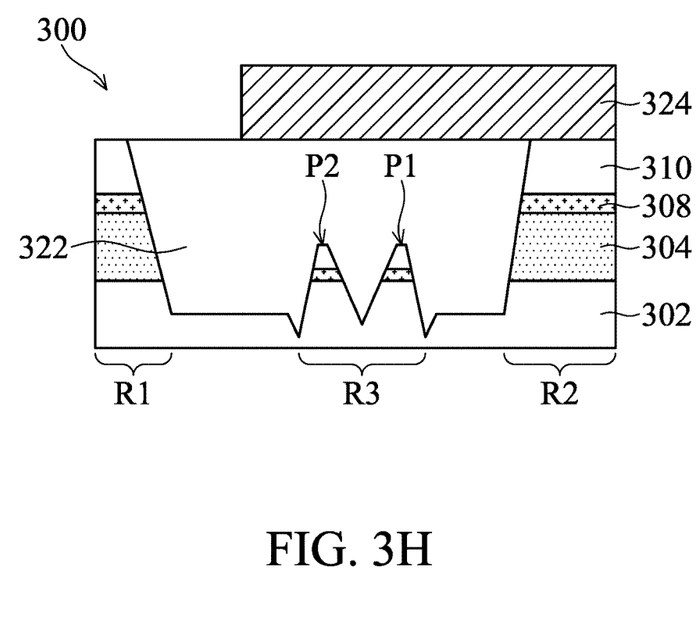

Then, as shown in FIG. 3H, according to some embodiments, a control gate 324 is formed over the active region R2. The material of the control gate 324 may include any suitable material, such as polysilicon, and may be doped with n-type or p-type dopants. An annealing process may be performed to activate the implanted dopants.

As shown in FIG. 3H, the control gate 324 may extend above the buried dummy structures P1 and P2 and partially expose the top surface of the dielectric structure 322. The control gate 324 may also further extend above the second recess A2 (FIG. 3F), but not above the dummy region R1.

In some embodiments, the method for forming the semiconductor structure 300 self-alignedly forms the buried dummy structures P1 and P2 around the active region R2, which can shorten the distance between the active region R2 of the substrate 302 and the protrusion, without being limited by the mask pattern design. As a result, the performance of the semiconductor structure 300 can be improved, and the dimension of the semiconductor structure 300 can be reduced.

Figure 4:
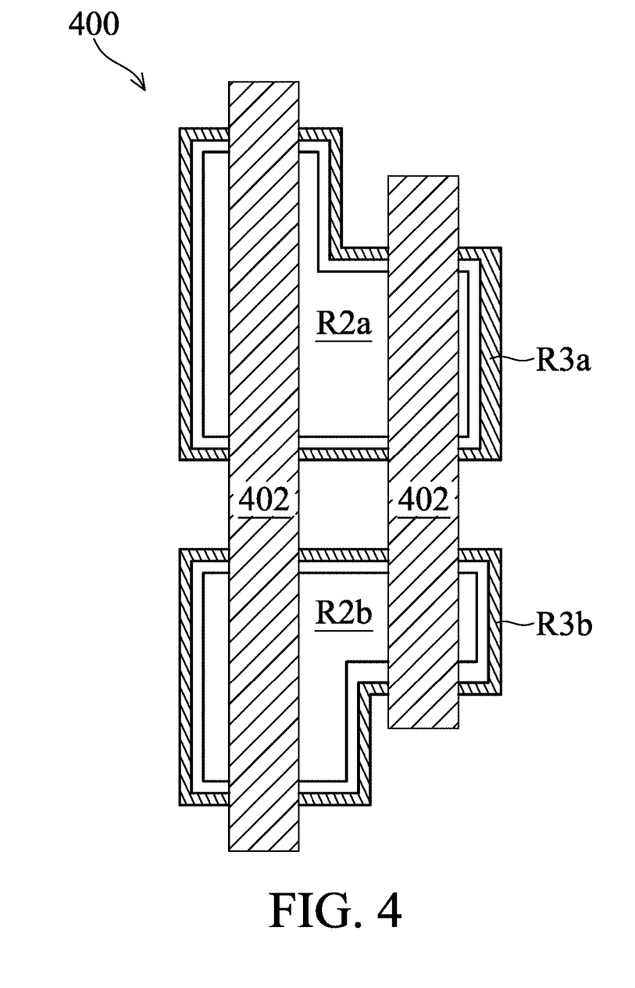

FIG. 4 is a top view illustrating a semiconductor structure 400 according to some embodiments. Additional components may be added to semiconductor structure 400. Some of the components described below may be replaced or eliminated for different embodiments. To simplify the figure, only a portion of the semiconductor structure 400 is illustrated.

As shown in FIG. 4, the semiconductor structure 400 may include more than one active region, such as active regions R2a and R2b. The self-alignedly forming method according to the embodiment of the present disclosure may form buried dummy structures (i.e., regions R3a and R3b) around the active regions R2a and R2b, respectively, and the distances between the active regions R2a and R2b and the buried dummy structures (i.e., the regions R3a and R3b) are approximately equal. Therefore, the process such as etching process or planarization process can be uniformly improved to increase the process accuracy.

As shown in FIG. 4, the semiconductor structure 400 may include a plurality of control gates 402 extending over the active regions R2a and R2b. The control gates 402 may be substantially parallel to each other in the length direction of the control gates 402. In addition, the control gates 402 may also extend over regions R3a and R3b.

In summary, the semiconductor structure provided by the embodiments of the present disclosure includes a buried dummy structure, which can shorten the distance between an active region and a protrusion of the substrate, and thus can block dopants in the substrate from diffusing into the dielectric structure in substrate. As a result, the performance of the semiconductor structure can be improved. In addition, the shortened distance can also shrink the dimension of the semiconductor structure.

Furthermore, since the method for forming the semiconductor structure adopts a self-alignedly formed mask, the shortened distance may not be limited by the design of the mask. Moreover, the method for forming the semiconductor structure can make the distance between the buried dummy structure and the active region substantially the same, thereby improving the process accuracy.

What is claimed is:

1. A semiconductor structure, comprising:
   a substrate having a protrusion, a first recess, and a second recess, wherein the first recess and the second recess are on opposite sides of the protrusion:
   a dielectric structure extending from the first recess and the second recess to above a top surface of the protrusion;
   a floating gate disposed over the substrate and adjoining a sidewall of the dielectric structure; and
   a control gate disposed over the floating gate and extending over a top surface of the dielectric structure to directly above the protrusion.

2. The semiconductor structure as claimed in claim 1, wherein the protrusion comprises a first pillar adjacent to the first recess and a second pillar adjacent to the second recess, and the dielectric structure extends between the first pillar and the second pillar to below a top surface of the substrate.

3. The semiconductor structure as claimed in claim 1, wherein the floating gate is not disposed directly above the protrusion.

4. The semiconductor structure as claimed in claim 1, wherein the floating gate has a first portion disposed over an active region of the substrate and adjoining the sidewall of the dielectric structure, and in a top view, the protrusion surrounds the active region.

5. The semiconductor structure as claimed in claim 4, wherein the floating gate has a second portion disposed over a dummy region of the substrate and adjoining another sidewall of the dielectric structure, and in the top view, the second portion of the floating gate surrounds the protrusion.

6. The semiconductor structure as claimed in claim 1, further comprising an inter-gate dielectric layer disposed over the substrate,
   wherein a first width of a bottom of the protrusion is greater than a second width of a top of the protrusion, and the second width is greater than a third width of a top of the inter-gate dielectric layer.

7. The semiconductor structure as claimed in claim 1, wherein the first recess has a first side away from the protrusion and a second side adjacent to the protrusion, and the dielectric structure has a first thickness on the first side of the first recess and a second thickness on the second side of the first recess, wherein the first thickness is less than the second thickness.

8. The semiconductor structure as claimed in claim 1, wherein the dielectric structure has a third thickness over the protrusion which is less than the first thickness.

9. The semiconductor structure as claimed in claim 1, wherein the control gate exposes a portion of the top surface of the dielectric structure.

10. The semiconductor structure as claimed in claim 1, wherein the control gate further extends above the second recess.

11. A method of forming a semiconductor structure, comprising:
   forming a floating gate over a substrate;
   forming a trench in the floating gate to expose a top surface of the substrate;
   forming a self-aligned core structure in the trench;
   forming a photoresist such that the photoresist comprises a first portion covering a top surface of the floating gate and a top surface of the self-aligned core structure and a second portion covering a sidewall of the self-aligned core structure;

removing the self-aligned core structure and the first portion of the photoresist and leaving the second portion of the photoresist; and etching the substrate using the second portion of the photoresist as a mask to form a first recess, a second recess and a buried dummy structure.

12. The method for forming a semiconductor structure as claimed in claim 11, wherein the first recess has a V-shaped bottom surface and a horizontal bottom surface connected to the V-shaped bottom surface.

13. The method for forming a semiconductor structure as claimed in claim 11, wherein the second portion of the photoresist comprises a pair of sheet structures.

14. The method for forming a semiconductor structure as claimed in claim 13, wherein a first distance between bottoms of the two sheet structures is greater than a second distance between tops of the two sheet structures.

15. The method for forming a semiconductor structure as claimed in claim 11, wherein forming the self-aligned core structure comprises:

forming a mask layer and a bottom anti-reflective coating layer over the substrate to fill the trench and cover the floating gate; and trimming the mask layer and the bottom anti-reflective coating layer and leaving a portion of the bottom anti-reflective coating layer and the mask layer in the trench to form the self-aligned core structure.

16. The method for forming a semiconductor structure as claimed in claim 11, wherein the buried dummy structure comprises a pair of pillar structures, each of which has a tapered sidewall, and a first width of a bottom of one of the pillar structures is greater than a second width of a top of the pillar structure.

17. The method for forming a semiconductor structure as claimed in claim 11, wherein forming the trench divides the floating gate into a third portion and a fourth portion, the third portion of the floating gate is disposed over an active region of the substrate, and the fourth portion of the floating gate is disposed over a dummy region of the substrate.

18. The method for forming a semiconductor structure as claimed in claim 17, further comprising:

after etching the substrate, forming a dielectric structure over the substrate to cover a top surface and a sidewall of the buried dummy structure and to cover sidewalls and bottom surfaces of the first recess and the second recess; and forming a control gate over the third portion of the floating gate, wherein the control gate extends over the buried dummy structure but does not extend over the fourth portion of the floating gate.

* * * * *